(12) United States Patent
Nishida et al.

(10) Patent No.: US 11,749,581 B2
(45) Date of Patent: Sep. 5, 2023

(54) SEMICONDUCTOR MODULE AND METHOD FOR MANUFACTURING SAME

(71) Applicants: FUJI ELECTRIC CO., LTD., Kawasaki (JP); DOWA METALTECH CO., LTD., Tokyo (JP)

(72) Inventors: Yuhei Nishida, Nagano (JP); Fumihiko Momose, Nagano (JP); Takashi Ideno, Tokyo (JP); Yukihiro Kitamura, Tokyo (JP)

(73) Assignees: FUJI ELECTRIC CO., LTD., Kawasaki (JP); DOWA METAL TECH CO., LTD., Tokyo (JP)

( * ) Notice: Subject to any disclaimer, the term of this patent is extended or adjusted under 35 U.S.C. 154(b) by 365 days.

(21) Appl. No.: 16/955,115

(22) PCT Filed: Feb. 6, 2019

(86) PCT No.: PCT/JP2019/004302
§ 371 (c)(1),
(2) Date: Jun. 18, 2020

(87) PCT Pub. No.: WO2019/159798
PCT Pub. Date: Aug. 22, 2019

(65) Prior Publication Data
US 2020/0388553 A1 Dec. 10, 2020

(30) Foreign Application Priority Data
Feb. 19, 2018 (JP) .............................. JP2018-027138

(51) Int. Cl.
*H01L 23/373* (2006.01)
*H01L 21/48* (2006.01)
(Continued)

(52) U.S. Cl.
CPC ...... *H01L 23/3735* (2013.01); *H01L 21/4882* (2013.01); *H01L 23/053* (2013.01);
(Continued)

(58) Field of Classification Search
CPC ............. H01L 23/3735; H01L 21/4882; H01L 23/053; H01L 23/3121; H01L 23/562;
(Continued)

(56) References Cited

U.S. PATENT DOCUMENTS

2003/0019843 A1 1/2003 Kawai et al.
2003/0127725 A1 7/2003 Sugaya et al.
(Continued)

FOREIGN PATENT DOCUMENTS

CN 101932439 A 12/2010
CN 102318452 A 1/2012
(Continued)

OTHER PUBLICATIONS

Korea Patent Office, "Office Action for Korean Patent Application No. 10-2020-7017893," dated Sep. 24, 2021.
(Continued)

*Primary Examiner* — Patricia D Valenzuela
(74) *Attorney, Agent, or Firm* — Manabu Kanesaka

(57) ABSTRACT

Provided are a semiconductor module in which bonding properties between an insulated substrate and a sealing resin is improved and a method for manufacturing the semiconductor module. A semiconductor module 50 is provided with: an insulated substrate 23; a circuit pattern 24 that is formed on the insulated substrate; semiconductor elements 25, 26 that are joined on the circuit pattern; and a sealing resin 28 for sealing the insulated substrate, the circuit pattern, and the semiconductor elements. The surface 23*a* of the insulated substrate in a part where the insulative substrate and the sealing resin are bonded to each other, is
(Continued)

characterized in that, in a cross section of the insulated substrate, the average roughness derived in a 300-μm wide range is 0.15 μm or greater and the average roughness derived in a 3-μm-wide range is 0.02 μm or greater.

13 Claims, 7 Drawing Sheets

(51) Int. Cl.
| | |
|---|---|
| *H01L 23/053* | (2006.01) |
| *H01L 23/31* | (2006.01) |
| *H01L 23/00* | (2006.01) |
| *H01L 25/07* | (2006.01) |
| *H01L 23/495* | (2006.01) |
| *H01L 25/16* | (2023.01) |

(52) U.S. Cl.
CPC ........ *H01L 23/3121* (2013.01); *H01L 23/562* (2013.01); *H01L 24/32* (2013.01); *H01L 24/48* (2013.01); *H01L 24/73* (2013.01); *H01L 25/072* (2013.01); *H01L 23/495* (2013.01); *H01L 25/162* (2013.01); *H01L 2224/32225* (2013.01); *H01L 2224/48139* (2013.01); *H01L 2224/48225* (2013.01); *H01L 2224/73265* (2013.01); *H01L 2924/05032* (2013.01); *H01L 2924/13055* (2013.01); *H01L 2924/13091* (2013.01); *H01L 2924/15787* (2013.01); *H01L 2924/35121* (2013.01)

(58) Field of Classification Search
CPC ......... H01L 24/32; H01L 24/48; H01L 24/73; H01L 25/072; H01L 2224/32225; H01L 2224/48139; H01L 2224/48225; H01L 2224/73265; H01L 2924/05032; H01L 2924/13055; H01L 2924/13091; H01L 2924/15787; H01L 2924/35121; H01L 24/29; H01L 2224/291; H01L 2224/32227; H01L 2224/48227; H01L 2924/181; H01L 21/4807; H01L 21/56; H01L 23/057; H01L 23/3142; H01L 23/49811; H01L 23/24; H01L 2224/48137; H01L 23/15; H01L 25/07; H01L 25/18; H01L 23/495; H01L 25/162; H05K 1/0306; H05K 3/284; H05K 2201/2072; H05K 3/281; C04B 2235/96; C04B 2237/366; C04B 2237/407; C04B 2237/52; C04B 37/026

See application file for complete search history.

(56) References Cited

U.S. PATENT DOCUMENTS

| | | | |
|---|---|---|---|
| 2005/0239380 A1 | 10/2005 | Hosaka et al. | |
| 2006/0037536 A1* | 2/2006 | Kobayashi | C23C 4/02 |
| | | | 427/446 |
| 2007/0209201 A1* | 9/2007 | Koutsaroff | H01G 13/04 |
| | | | 29/830 |
| 2008/0170372 A1 | 7/2008 | Kirigaya | |
| 2010/0078813 A1 | 4/2010 | Okayama et al. | |
| 2011/0005812 A1 | 1/2011 | Shimokawa et al. | |
| 2011/0177292 A1* | 7/2011 | Teshima | B23K 26/40 |
| | | | 428/156 |
| 2011/0186993 A1 | 8/2011 | Kobayashi et al. | |
| 2011/0308848 A1 | 12/2011 | Ito et al. | |
| 2012/0119358 A1 | 5/2012 | Oh | |
| 2014/0374889 A1* | 12/2014 | Denta | H01L 23/49517 |
| | | | 257/666 |
| 2019/0333869 A1* | 10/2019 | Teng | H01L 21/4853 |

FOREIGN PATENT DOCUMENTS

| | | |
|---|---|---|
| CN | 107563087 A | 1/2018 |
| JP | H05-24959 A | 2/1993 |
| JP | H08-222661 A | 8/1996 |
| JP | 2002-241187 A | 8/2002 |
| JP | 2005-225745 A | 8/2005 |
| JP | 2006-145320 A | 6/2006 |
| JP | 2008-172172 A | 7/2008 |
| JP | 2010-030280 A | 2/2010 |
| JP | 2010-087309 A | 4/2010 |
| JP | 2011-052240 A | 3/2011 |
| JP | 2012-054368 A | 3/2012 |
| JP | 2013-027918 A | 2/2013 |
| JP | 2013-149911 A | 8/2013 |
| JP | 2013-258321 A | 12/2013 |
| JP | 2015-132013 A | 7/2015 |
| JP | 2017-011049 A | 1/2017 |
| KR | 20060047248 A | 5/2006 |

OTHER PUBLICATIONS

Europe Patent Office, "Search Report for European Patent Application No. 19753674.1," dated Nov. 27, 2020.
PCT/ISA/210, "International Search Report for International Application No. PCT/JP2019/004302," dated Apr. 23, 2019.
China National Intellectual Property Administration, "Office Action with Search Report for Chinese Patent Application 201980006691.7," dated Jan. 10, 2023.

* cited by examiner

ARITHMETIC AVERAGE ROUGHNESS OF CONTOUR CURVE (EXAMPLE OF ROUGH CURVE)

SEMICONDUCTOR MODULE AND METHOD FOR MANUFACTURING SAME

RELATED APPLICATIONS

The present application is National Phase of International Application No. PCT/JP2019/004302 filed Feb. 6, 2019, and claims priority from Japanese Application No. 2018-027138, filed Feb. 19, 2018, the disclosure of which is hereby incorporated by reference herein in its entirety.

TECHNICAL FIELD

The present invention relates to: a semiconductor module having a structure in which a semiconductor element is joined to an insulated substrate via a circuit pattern and in which the insulated substrate, the circuit pattern, and the semiconductor element are sealed using a sealing resin; and a method for manufacturing the semiconductor module.

BACKGROUND ART

In power semiconductor modules that are used as power-conversion switching devices, e.g., as indicated in Patent Document 1, a structure is adopted which an insulated substrate, a circuit pattern, and a semiconductor element are sealed using a sealing resin in order to impart insulation properties, heat resistance, and durability.

However, repeated exposure to high temperature due to heat generated during operation as a switching device has resulted in delamination of an adhesive surface between the insulated substrate and the sealing resin. Delamination extending into the interior has allowed water ingress, wiring lift-off and other adverse events to occur.

In response, technologies for increasing adhesiveness to a metal film and to a sealing resin by roughening the surface of an insulated substrate to heighten an anchoring effect have been disclosed.

For example, Patent Document 2 discloses a method for manufacturing a ceramic circuit substrate, the method including forming fine asperities on the surfaces of crystal particles through ion-beam etching in order to increase bonding force with a metal film.

Patent Document 3 discloses a ceramic member in which a plurality of protrusions having a smaller diameter than the diameter of crystal particles are formed through acidic etching on the surfaces of the crystal particles in order to enhance an anchoring effect.

Patent Document 4 discloses a ceramic base body provided with a plurality of recesses and protrusions having greater asperities than the average crystal grain diameter, whereby an anchoring effect of a brazing material is enhanced.

Furthermore, Patent Document 5 indicates that a surface is roughened by bringing abrasive grains into contact with the surface of an aluminum nitride substrate, and the joining strength of a metal circuit foil is increased.

Furthermore, Patent Document 6 discloses an electronic control device provided with: a circuit substrate; a heat sink on which the circuit substrate is mounted; a lead electrically connected to the circuit substrate; and a sealing resin part that covers the circuit substrate as well as a connection part between the circuit substrate and the lead, the sealing resin part being such that a sealing resin is arranged so that a portion of the lead and a portion of the heat sink are exposed to the outside, wherein, in the surface of the circuit substrate and/or the surface of the heat sink, at least a portion of a site in contact with the sealing resin part is subjected to a roughening process.

RELATED ART DOCUMENTS

Patent Documents

[Patent Document 1] Japanese Laid-open Patent Publication No. 2013-258321
[Patent Document 2] Japanese Laid-open Patent Publication No. H5-24959
[Patent Document 3] Japanese Laid-open Patent Publication No. 2002-241187
[Patent Document 4] Japanese Laid-open Patent Publication No. 2010-30280
[Patent Document 5] Japanese Laid-open Patent Publication No. 2013-27918
[Patent Document 6] Japanese Laid-open Patent Publication No. 2008-172172

DISCLOSURE OF THE INVENTION

Problems to be Solved by the Invention

However, in Patent Documents 1 to 5, no consideration is given to surface roughening of the insulated substrate for the purpose of improving bonding strength between the insulated substrate and the sealing resin. Moreover, Patent Document 6 does not specifically disclose the conditions of the roughening process.

Therefore, it cannot yet be said that the effect for improving bonding properties between an insulated substrate and sealing resin is adequate in the features disclosed in the related art.

Therefore, it is an object of the present invention to provide a semiconductor module in which bonding properties between an insulated substrate and a sealing resin are further improved, and a method for manufacturing the semiconductor module.

Means to Solve the Problems

In order to achieve the above object, a semiconductor module according to the present invention is provided with:
 an insulated substrate;
 a circuit pattern formed on the insulated substrate;
 a semiconductor element joined on the circuit pattern; and
 a sealing resin for sealing the insulated substrate, the circuit pattern, and the semiconductor element,
 the semiconductor module being characterized in that a surface of the insulated substrate in a portion where the insulated substrate and the sealing resin are bonded is such that, in a cross-section of the insulated substrate, the average roughness derived in a 300-μm-wide range is 0.15 μm or greater, and the average roughness derived in a 3-μm-wide range is 0.02 μm or greater, the average roughness being measured and calculated in accordance with the following method.

(Method for Measuring/Calculating Average Roughness)
A cross-section of the insulated substrate is imaged using a scanning electron microscope to prepare an SEM image, the SEM image is binarized to prepare image data for the surface shape, the image data is converted to two-dimensional coordinate data using image quantification software, and the average roughness Za is derived by computation through the following formula.

$$Za = \frac{1}{N}\sum_{n=1}^{N}|Zn|  \quad \text{[Formula 1]}$$

In the formula, Za represents the average roughness. Zn represents the difference between the two-dimensional coordinate data and an average value for each n. N represents a value obtained by dividing a measured width by a measured pitch; in computation of the roughness for a width of 300 µm, the pitch is equal to 0.5 µm, that means N is equal to 600, and in computation of the roughness for a width of 3 µm, the pitch is equal to 0.005 µm, that means N is equal to 600.

In the semiconductor module according to the present invention, the portion where the insulated substrate and the sealing resin are bonded preferably includes a peripheral edge part of the insulated substrate.

The surface of the insulated substrate in the portion where the insulated substrate and the sealing resin are bonded preferably is such that, in a cross-section of the insulated substrate, the average roughness derived in a 300-µm-wide range is 2 µm or less.

The surface of the insulated substrate in the portion where the insulated substrate and the sealing resin are bonded furthermore preferably is such that, in a cross-section of the insulated substrate, the average roughness derived in a 300-µm-wide range is 0.7 µm or greater.

The surface of the insulated substrate in the portion where the insulated substrate and the sealing resin are bonded yet furthermore preferably is such that the average roughness derived in a 3-µm-wide range is 0.1 µm or less.

In addition, a method for manufacturing a semiconductor module according to the present invention is provided with:
a surface treatment step for adjusting the surface roughness of a ceramic insulated substrate;
an oxidizing treatment step for heat-treating the insulated substrate to oxidize the surface of the insulated substrate;
a brazing material application step for applying a brazing material to the surface of the insulated substrate;
a metal foil joining step for joining a metal foil to the surface of the insulated substrate via the brazing material;
a circuit pattern formation step for etching the metal foil and the brazing material to form a circuit pattern;
a semiconductor element implementation step for joining a semiconductor element to the circuit pattern; and
a sealing step for sealing the insulated substrate, the circuit pattern, and the semiconductor element using a sealing resin,
the method for manufacturing a semiconductor module being characterized in that:
the surface treatment step includes a step for performing a wet blasting treatment on the surface of the insulated substrate to roughen the surface so as to reach an average roughness of 0.15 µm or greater as derived in a 300-µm-wide range in a cross-section of the insulated substrate;
the brazing material application step included a step for applying the brazing material not only to the surface of the insulated substrate where the metal foil is joined, but also to a surface of the insulated substrate where the metal foil is not joined, the surface being where the sealing resin is bonded; and
in the circuit pattern formation step, a portion where the brazing material is applied is etched, whereby the surface of the insulated substrate where the sealing resin is bonded is configured to have a surface roughness such that, in a cross-section of the insulated substrate, the average roughness derived in a 300-µm-wide range is 0.15 µm or greater, and the average roughness derived in a 3-µm-wide range is 0.02 µm or greater, the average roughness being measured and calculated in accordance with the method described above.

In the method for manufacturing a semiconductor according to the present invention, the insulated substrate is preferably made of a ceramic, and is more preferably composed of aluminum nitride.

In addition, an insulated circuit substrate according to the present invention is provided with:
an insulated substrate; and
a circuit pattern formed on the insulated substrate,
the insulated circuit substrate being characterized in that
a surface of the insulated substrate in a portion where the circuit pattern is not formed is such that, in a cross-section of the insulated substrate, the average roughness derived in a 300-µm-wide range is 0.15 µm or greater, and the average roughness derived in a 3-µm-wide range is 0.02 µm or greater, the average roughness being measured and calculated in accordance with the method described above.

Effect of the Invention

In the semiconductor module according to the present invention, the surface of the insulated substrate in the portion where the insulated substrate and the sealing resin are bonded is such that, in a cross-section of the insulated substrate, the average roughness derived in a 300-µm-wide range is 0.15 µm or greater, and the average roughness derived in a 3-µm-wide range is 0.02 µm or greater. This improves the bonding strength between the insulated substrate and the sealing resin, maintains a high bonding strength even under high temperature, and suppresses delamination of the sealing resin. It is therefore possible to improve the durability of the semiconductor module.

In the method for manufacturing a semiconductor module according to the present invention, comparatively rough asperities are formed in the surface of the insulated substrate through the wet blasting treatment, and the brazing material is furthermore applied and etched in the surface to which the metal foil is not joined, the surface being where the sealing resin is directly bonded. This makes it possible to furthermore form fine asperities in the surface having the comparatively rough asperities, further increases the bonding strength of the sealing resin by the rough surface in which the fine asperities are furthermore formed in the surface having the rough asperities, and makes it possible to suppress delamination of the sealing resin.

In the insulated circuit substrate according to the present invention, when it is used as an insulated circuit substrate of a semiconductor module and is sealed using a sealing resin, the bonding strength between the insulated substrate and the sealing resin increases, a high bonding strength is maintained even under high temperature, and delamination of the sealing resin is suppressed. It is therefore possible to improve the durability of the semiconductor module.

EMBODIMENT FOR CARRYING OUT THE INVENTION

Embodiments of a semiconductor module according to the present invention are described below with reference to the accompanying drawings.

Figure 1:
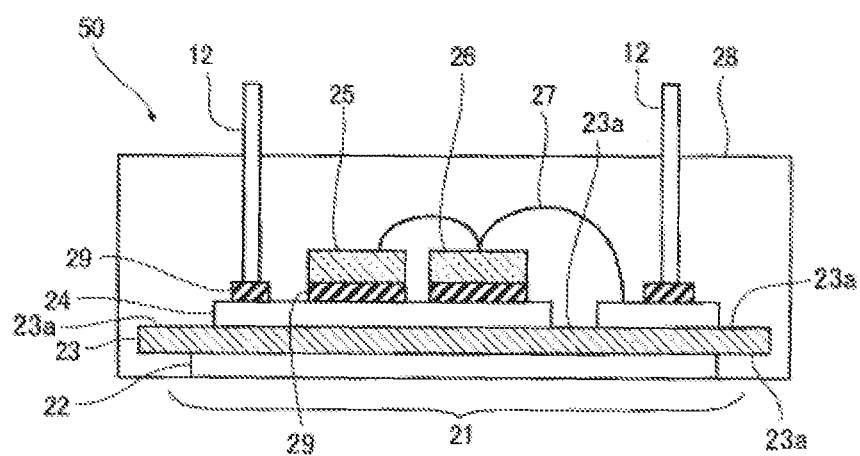
FIG. 1 is a cross-sectional view of a semiconductor module according to an embodiment of the present invention.

FIG. 1 shows a first embodiment of a semiconductor module to which the present invention is applied. The semiconductor module 50 is a power semiconductor module, wherein a circuit pattern 24 is formed on the upper surface of an insulated substrate 23, and a metal sheet 22 having excellent thermal conductivity is joined to the lower surface of the insulated substrate 23. An insulated circuit substrate 21 is configured from the insulated substrate 23, the circuit pattern 24, and the metal sheet 22.

A ceramic substrate in which the main component is, e.g., aluminum nitride, alumina, or silicon nitride is preferably used as the insulated substrate 23. However, it is also possible to use, inter alia, a substrate in which the surface of a metal sheet composed of aluminum, etc., is coated with an insulating resin layer. A ceramic substrate composed of an aluminum nitride sintered compact is particularly preferred. The average crystal grain diameter of the ceramic in the ceramic substrate is preferably 0.5 to 20 µm, and more preferably 2 to 7 µm. The aluminum nitride sintered compact can be obtained by sintering a molded body composed of an aluminum nitride raw powder having an average particle diameter of 0.1 to 15 µm. The molded body may include a sintering auxiliary agent, an organic binder, etc., as necessary.

An article obtained by etching a metal foil joined to the insulated substrate 23 via a brazing material to form a pattern is preferably employed as the circuit pattern 24. The metal foil is not particularly limited; however, as an example, copper is preferably employed. The metal sheet 22 is not particularly limited, provided that the metal sheet 22 has excellent thermal conductivity; however, as an example, a metal sheet made of copper, aluminum, a copper alloy, or an aluminum alloy is used.

Semiconductor elements 25, 26 are joined on the circuit pattern 24 via solder 29. An external terminal 12 is provided upright on the circuit pattern 24 via the solder 29, and the semiconductor elements 25, 26 and the external terminal 12 are connected by the circuit pattern 24 or a bonding wire 27.

The semiconductor elements 25, 26 are, e.g., insulated gate bipolar transistors (IGBTs) or power metal oxide semiconductor field effect transistors (power MOSFETs). The IGBTs may be reverse blocking-IGBTs (RB-IGBTs) or reverse conducting-IGBTs (RC-IGBTs).

Furthermore, the insulated substrate 23, the circuit pattern 24, the semiconductor elements 25, 26, lower portions of the external terminal 12, and the side surfaces of the metal sheet 22 are sealed using sealing resin 28, with the lower surface of the metal sheet 22 and the upper portion of the external terminal 12 being excluded from sealing. The sealing resin 28 is not particularly limited; however, as an example, an epoxy resin, a maleimide resin, a silicone resin, or a liquid crystal polymer is used.

The sealing resin 28 is bonded to each of the insulated substrate 23, the circuit pattern 24, the semiconductor elements 25, 26, the lower portions of the external terminal 12, and the side surfaces of the metal sheet 22. The insulated substrate 23 has a surface 23a that is bonded (adherent) to the sealing resin 28 (referred to as a "sealing-resin-bonded surface" below). The sealing-resin-bonded surface 23a is formed as being a peripheral edge part of the insulated substrate 23 so as to surround the outer periphery of the metal sheet 22 and the circuit pattern 24. In the present embodiment, the sealing-resin-bonded surface 23a is formed, in addition to as being the peripheral edge part on the upper-surface side of the insulated substrate 23, it is formed as being the outer-peripheral-side surface of the insulated substrate 23 and as being the peripheral edge part on the lower-surface side of the insulated substrate 23, the peripheral edge part being positioned on the outer periphery of the metal sheet 22.

Figure 2:
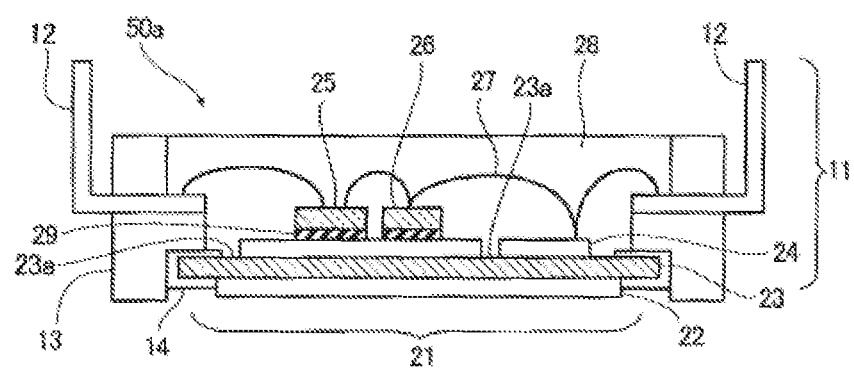
FIG. 2 is a cross-sectional view of a semiconductor module according to another embodiment of the present invention.

FIG. 2 shows another embodiment of a semiconductor module to which the present invention is applied. This semiconductor module 50a also is a power semiconductor module, wherein a circuit pattern 24 is formed on the upper surface of an insulated substrate 23, and a metal sheet 22 having excellent thermal conductivity is joined to the lower surface of the insulated substrate 23. An insulated circuit substrate 21 is configured from the insulated substrate 23, the circuit pattern 24, and the metal sheet 22.

However, in this semiconductor module 50a, a frame-shaped case 13 made of a resin is provided surrounding the insulated circuit substrate 21, and the peripheral edge part of the insulated circuit substrate 21 is anchored to the case 13 via an adhesive 14. A lower portion of an external terminal 12 that is bent in an L-shape is integrally molded with the case 13 so as to be exposed to the interior of the case 13 through the case 13, constituting an insert case 11.

Semiconductor elements 25, 26 are joined on the circuit pattern 24 via solder 29. The semiconductor elements 25, 26 and the external terminal 12 are connected by the circuit pattern 24 or a bonding wire 27.

Furthermore, the interior of the case 13 is filled with a sealing resin 28, and the insulated substrate 23, the circuit pattern 24, the semiconductor elements 25, 26, and the lower portion of the external terminal 12 are sealed by the sealing resin 28. In the present embodiment as well, the insulated substrate 23 has a sealing-resin-bonded surface 23a that is bonded (adherent) to the sealing resin 28. The sealing-resin-bonded surface 23a is formed as being the peripheral edge part or the insulated substrate 23.

The characteristics of the semiconductor module according to the present invention are such that the surface roughness on the sealing-resin-bonded surface 23a of the insulated substrate 23 in the semiconductor module 50, 50a described above is set to a specific surface roughness.

Specifically, the semiconductor module 50, 50a according to the present invention is characterized in that the average roughness derived in a 300-µm-wide range is 0.15 µm or greater, and the average roughness derived in a 3-µm-wide range is 0.02 µm or greater, in the sealing-resin-bonded surface 23a of the insulated substrate 23. A method for measuring and calculating the average roughness employed in the present invention is described detail below.

Figure 3:
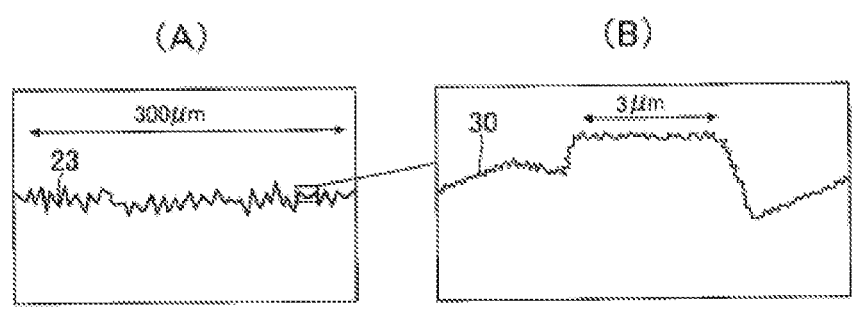
FIGS. 3(A) and 3(B) are schematic diagrams showing the roughness of the surface of an insulated substrate in the semiconductor module according to the present invention.

FIGS. 3(A) and 3(B) depict the surface shape in a cross-section of the insulated substrate 23 at the sealing-resin-bonded surface 23a. The surface shape from the cross-section of the insulated substrate 23 can be extracted by imaging a cross-section perpendicular to the surface of the substrate using a scanning electron microscope to prepare an SEM image, binarizing the SEM image to prepare image data that reflects the surface shape, and converting the image data to two-dimensional coordinate data.

The SEM image can be binarized by maximizing the contrast using software that has an image processing function, such as "Microsoft PowerPoint" (trade name; produced by Microsoft Corp.). Other software may also be used as the software that has an image processing function.

FIG. 3(A) shows a shape taken along the surface of a cross-section of the insulated substrate 23 so that the width indicated by arrows in the drawing is 300 μm. FIG. 3(B) shows a shape in which a portion of the aforementioned shape is taken so that the width indicated by arrows in the drawing is 3 μm. Reference symbol 30 indicates the surfaces of crystal grains.

The surface shape in FIG. 3(A) (width: 300 μm) can be retrieved using, e.g., an SEM image captured at a magnification of 1,000×. The surface shape in FIG. 3(B) (width: 3 μm) can be retrieved using, e.g., an SEM image of the surfaces of crystal grains captured at a magnification of 15,000×.

Figure 4:
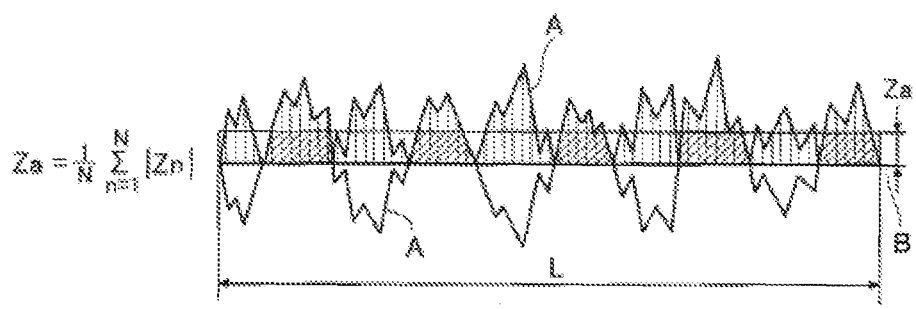
FIG. 4 is an explanatory drawing showing a computational formula for surface roughness and a general concept underlying the same.

Such a binarized image of the surface shape can be quantified using image quantification software, such as "Graphcel" (trade name; freeware), and then the average roughness can be derived through calculation by the following numerical formula shown in FIG. 4 using spreadsheet software, such as "Microsoft Excel" (trade name; produced by Microsoft Corp.).

$$Za = \frac{1}{N}\sum_{n=1}^{N} |Zn| \quad \text{[Formula 2]}$$

In the above numerical formula, Za represents the average roughness. Zn represents the difference between the two-dimensional coordinate data and an average value for each n. N represents a value obtained by dividing a measured width by a measured pitch; in computation of the roughness for a width of 300 μm, the pitch is equal to 0.5 μm, that means N is equal to 600, and in computation of the roughness for a width of 3 μm, the pitch is equal to 0.005 μm, that means N is equal to 600.

To measure the average roughness, the surface shape from the cross-section is measured in three or more locations, and the average value thereof is used as a measurement value.

In the present invention, when, e.g., the width of 300 μm shown by the arrows in FIG. 3(A) is used as a reference length L, a value in which the average roughness is derived through the formula shown in FIG. 4 from the surface shape of that portion is 0.15 μm or greater. Moreover, when the width of 3 μm shown by the arrows in FIG. 3(B) is used as the reference length L, a value in which the average roughness is derived through the formula shown in FIG. 4 from the surface shape of that portion is 0.02 μm or greater.

Forming the sealing-resin-adhering surface 23a of the insulated substrate 23 so as to yield the surface shape described above improves the bonding strength between the insulated substrate 23 and the sealing resin 28, maintains a high bonding strength even under high temperature, and suppresses delamination of the sealing resin. It is therefore possible to improve the durability of the semiconductor module. In addition, the sealing-resin-adhering surface 23a of the insulated substrate 23 is formed as being the peripheral edge of the insulated substrate 23 so as to surround the circuit pattern 24, and delamination at that portion is suppressed, thereby making it possible to more solidly protect the circuit pattern 24 and the semiconductor elements 25, 26 joined thereto, and to increase reliability.

The average roughness of the sealing-resin-adhering surface 23a of the insulated substrate 23 as derived in a 300-μm-wide range is preferably 0.7 μm or greater, and more preferably 1.1 μm or greater, in order to further increase the bonding strength between the insulated substrate 23 and the sealing resin 28. However, the average roughness derived in the range having a width of 300 μm is preferably no greater than 2 μm so as not to adversely affect the shape of the circuit pattern 24, etc.

The average roughness of the sealing-resin-adhering surface 23a of the insulated substrate 23 as derived in a 3-μm-wide range is preferably 0.1 μm or less, in order to increase the bonding strength between the insulated substrate 23 and the sealing resin 28.

A method for manufacturing a semiconductor module according to the present invention is described next.

(Surface Treatment Step)

In the method for manufacturing a semiconductor module according to the present invention, a ceramic substrate is used as the insulated substrate 23. In particular, it is preferable to use a ceramic substrate composed of an aluminum nitride sintered compact.

The surface of the insulated substrate 23 is subjected to a wet blasting treatment and is roughened so that, in a cross-section of the insulated substrate 23, the average roughness derived in a 300-μm-wide range is 0.15 μm or greater.

The wet blasting treatment can be performed by using abrasive grains that have a higher hardness than the ceramic substrate, forming a liquid that includes the abrasive grains, and jetting the liquid onto the ceramic substrate together with compressed air. In such instances, the value of the average roughness derived in a 300-μm-wide range can be adjusted by adjusting the particle size of the abrasive grains or the jetting pressure.

(Oxidizing Treatment Step)

The insulated substrate 23 is then heat-treated to oxidize the surface of the insulated substrate 23. The heat treatment can be performed by, e.g., holding the temperature at 800 to 1200° C., and preferably 1000 to 1100° C., for 2 to 12 hours.

(Brazing Material Application Step)

A brazing material is then applied to the surface of the insulated substrate 23. It is preferable to use, as the brazing material, e.g., an active metal brazing material in which at least one active metal selected from Ti, Zr, Hf, Nb, etc., is included in an Ag—Cu brazing material. Sn, In, etc., may also be included as necessary. The active metal brazing material can preferably be used in the form of a paste. The brazing material can be applied, e.g., by screen printing, using a roll coater, or employing other techniques.

Conventionally, it is common for brazing materials to be applied only to a portion of the surface of the insulated substrate 23 where the metal foil for forming the circuit pattern 24 was to be joined. However, in the present invention, the brazing material is also applied to a portion where the metal foil is not joined, the portion forming a portion of the sealing-resin-adhering surface 23a of the insulated substrate 23. The brazing material is preferably applied to the entirety of the sealing-resin-adhering surface 23a of the insulated substrate 23.

(Metal Foil Joining Step)

The metal foil for forming the circuit pattern 24 is then disposed at a prescribed location in the portion of the surface of the insulated substrate 23 where the brazing material is applied, pressure is applied as necessary in this state, and heat treatment is conducted, whereby the brazing material is melted and the metal foil is joined to the surface of the insulated substrate 23 via the brazing material.

(Circuit Pattern Formation Step)

After the metal foil is joined in this manner, the metal foil and the brazing material are patterned by etching using a well-known method such as photo-etching to form the circuit pattern 24.

In such instances, the surface of the insulated substrate 23, which is appeared by etching and removing the brazing material anchored to the surface of the insulated substrate 23, is treated so that fine asperities having an average roughness of 0.02 µm or greater as derived in a 3-µm-wide range are formed in a surface having comparatively large asperities, the surface being formed, during the surface treatment step, by roughening so as to have an average roughness of 0.15 µm or greater as derived in a 300-µm-wide range.

The fine asperities are formed by etching and removing the brazing material anchored to the surface of the insulated substrate 23; such asperities would not be formed by etching a surface of the insulated substrate 23 that had been subjected merely to the oxidizing treatment. Therefore, the present invention is configured so that, in the brazing material application step, the brazing material is also applied to the portion where the metal foil is not joined in the portion of the insulated substrate 23 that forms the sealing-resin-adhering surface 23a.

(Semiconductor Element Implementation Step)

After the circuit pattern 24 is formed in this manner, the semiconductor elements 25, 26 and the external terminal 12 are joined via solder 29 in accordance with a usual method.

(Sealing Step)

Finally, inter alia, the insulated substrate 23, the circuit pattern 24, the semiconductor elements 25, 26, and the lower portion of the external terminal 12 are sealed by the sealing resin 28, whereby the semiconductor module 50, 50a can be manufactured.

In the resulting semiconductor module 50, 50a, the surface shape in the sealing-resin-adhering surface 23a of the insulated substrate 23 has comparatively rough asperities such that the average roughness derived in a 300-µm-wide range is 0.15 µm or greater, the surface shape being one in which fine asperities such that the average roughness derived in a 3-µm-wide range is 0.02 µm or greater are formed in the surface having comparatively large asperities. Therefore, as described above, the bonding strength between the insulated substrate 23 and the sealing resin 28 is improved, a high bonding strength is maintained even under high temperature, and delamination of the sealing resin is suppressed. It is therefore possible to improve the durability of the semiconductor module.

EXAMPLES

A ceramic substrate composed of an aluminum nitride sintered compact was used as the insulated substrate, an epoxy resin was used as the sealing resin, the surface roughness of the insulated substrate was changed, and the bonding strength between the insulated substrate and the sealing resin was measured.

(Method for Measuring Resin Bonding Strength)

Figure 5:
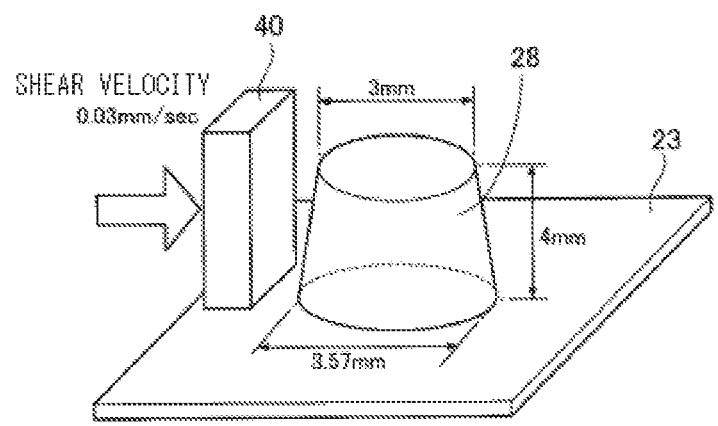
FIG. 5 is an explanatory drawing showing a method for measuring the delamination strength between the insulated substrate and a sealing resin.

A mold (not shown) was placed on the insulated substrate 23, resin was charged into the mold through holes provided therein, and the resin was thermally cured at 170° C. for 60 minutes, whereby sealing resin 28 having the size and shape shown in FIG. 5 (frustoconical, measuring 3.57 mm in bottom-surface diameter, 3 mm in upper-surface diameter, and 4 mm in height) was molded while joined to the insulated substrate 23, as shown in FIG. 5.

This sample was placed on a shear testing device (testing device in which a "DIGITAL FORCE GAUGE Model ZP-1000N" manufactured by Imada Co., Ltd., and a "FORCE GAUGE STAND Model FGS-50D" manufactured by Shimpo Industrial Co., Ltd., were combined), a plunger 40 was pressed against the molded sealing resin 28, the maximum load (kgf) when pressing and breaking at a shear velocity of 0.03 mm/sec was measured, and a bonding strength (MPa) was derived by dividing the resulting load by 10 mm$^2$.

Test Example 1

Comparative Example 1

A body molded from the sealing resin 28 was formed through the method described above on the surface of a ceramic substrate composed of an aluminum nitride sintered compact (referred to as a "standard article" below), the ceramic substrate having a surface roughness such that the average roughness derived in a 300-µm-wide range was 0.10 µm, and the average roughness derived in a 3-µm-wide range was 0.015 µm.

Comparative Example 2

An active-metal-containing paste brazing material (in which the weight ratio of metal components, i.e., Ag:Cu:Ti is equal to 80:17:3) was applied to the standard-article ceramic substrate, a copper foil made of oxygen-free copper was laminated on the brazing material, and the brazing material was melted by heating in a vacuum at 850° C. and then solidified, whereby the copper foil was anchored via the brazing material to the surface or the ceramic substrate. The metal foil was then removed using a cupric chloride etching liquid. The ceramic substrate was then immersed at 20° C. for 15 minutes in an aqueous solution including 5% hydrogen peroxide, 3% ammonia, and 1.6% by weight of EDTA, and then rinsed. The ceramic substrate was then immersed at 30° C. for 30 minutes in an aqueous solution including 2% DTPA-5Na and 5% hydrogen peroxide, whereby the brazing material was removed. A ceramic substrate was thus formed having a surface roughness such that the average roughness derived in a 300-µm-wide range was 0.10 µm, and the average roughness derived in a 3-µm-wide range was 0.025 µm. A body molded from the sealing resin 28 was formed on the surface of the substrate using the method described above.

Comparative Example 3

The surface of the standard-article ceramic substrate was treated using a wet blast machine manufactured by Fuji Kiko Co., Ltd., using a no. 320 alumina abrasive material at a pressure of 0.2 MPa. The ceramic substrate was then heat-treated in atmospheric air at 1050° C. for 2 hours to oxidize the surface thereof, and a ceramic substrate was formed having a surface roughness such that the average roughness derived in a 300-μm-wide range was 0.33 μm, and the average roughness derived in a 3-μm-wide range was 0.015 μm. A body molded from the sealing resin 28 was formed on the surface of the substrate using the method described above.

Example 1

The surface of the standard-article ceramic substrate was subjected to wet-blasting and oxidizing treatments under the same conditions as in comparative example 3, and a ceramic substrate was formed having a surface roughness such that the average roughness derived in a 300-μm-wide range was 0.33 μm, and the average roughness derived in a 3-μm-wide range was 0.015 μm. A brazing material was then applied under the same conditions as in comparative example 2, a copper foil was laminated thereon, and the brazing material was melted by heating in a vacuum at 850° C. and then solidified, whereby the copper foil was anchored via the brazing material to the surface of the ceramic substrate. The ceramic substrate was then immersed in an etching liquid in the same manner as in comparative example 2, and the copper foil, the brazing material, and a reaction layer were removed. A ceramic substrate was thus formed having a surface roughness such that the average roughness derived in a 300-μm-wide range was 0.33 μm, and the average roughness derived in a 3-μm-wide range was 0.025 μm. A body molded from the sealing resin 28 was formed on the surface of the substrate using the method described above.

The bonding strength (MPa) of the resulting samples in comparative examples 1 to 3 and example 1 was measured in accordance with the method shown in FIG. 5. The bonding strength was measured at both room temperature (R.T.; 25° C.) and a high temperature of 150° C. The results are shown in FIG. 6.

Figure 6:
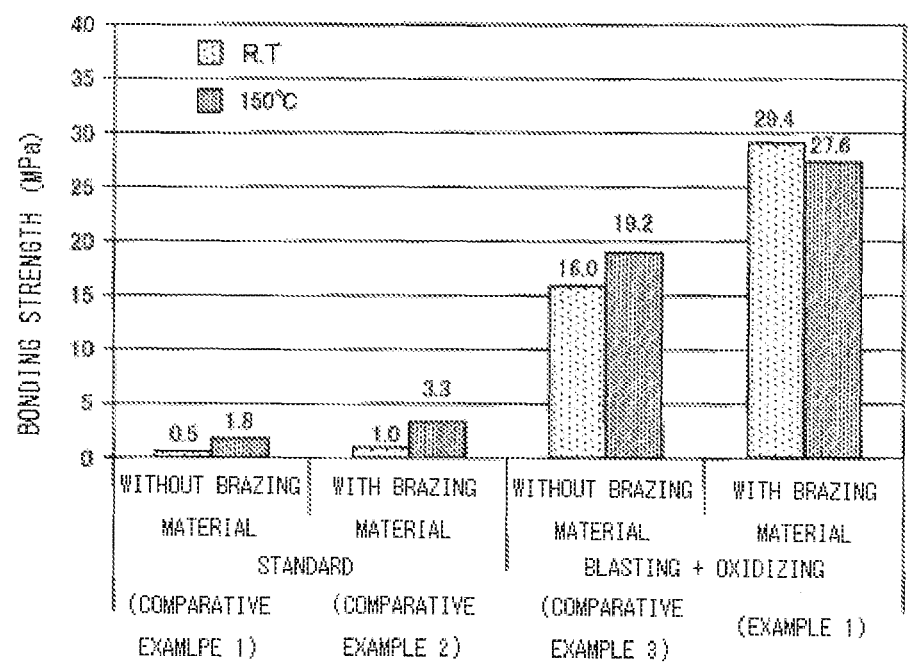
FIG. 6 is a graph showing the results of measuring the delamination strength between the insulated substrate and the sealing resin.

As shown in FIG. 6, the bonding strength was very low in comparative example 1, in which the standard article of a ceramic substrate composed of an aluminum nitride sintered compact was used without modification.

In the evaluation of bonding strength in comparative example 2, in which a molded article of the sealing resin 28 was formed on the surface of a ceramic substrate subjected to the processes in comparative example 2, the bonding strength was nearly doubled at both room temperature and high temperature, but still could not be said to be sufficient strength.

In the evaluation of bonding strength in comparative example 3, in which a molded article of the sealing resin 28 was formed on the surface of a ceramic substrate subjected to the processes in comparative example 3, the bonding strength improved at both room temperature and high temperature, but did not reach 25 MPa, which is a target value from the standpoint of adequately imparting heat resistance and durability to a semiconductor module.

However, in the evaluation of bonding strength in example 1, in which a molded article of the sealing resin 28 was formed on the surface of a ceramic substrate subjected to the processes in example 1, the bonding strength was notably improved at both room temperature and high temperature, and it was possible to reach a bonding strength of 25 MPa, which is the target value from the standpoint of adequately imparting heat resistance and durability to a semiconductor module.

Thus, it understood that it is possible to rapidly increase the bonding strength between an insulated substrate and a sealing resin by forming comparatively large asperities through a wet blasting treatment, subsequently performing an oxidizing treatment, and furthermore forming comparatively fine asperities through an etching treatment to achieve an average roughness of 0.15 μm or greater as derived in a 300-μm-wide range and moreover an average roughness of 0.02 μm or greater as derived in a 3-μm-wide range.

Test Example 2

A ceramic substrate composed or an aluminum nitride sintered compact (standard article) was used, and the same manufacturing method was carried out as in example 1, except that the conditions of the wet blasting treatment (treatment time) were changed, whereby articles were produced having varied average roughness derived in a 300-μm-wide range. The average roughness derived in a 3-μm-wide range was 0.02 μm or greater in all but a few cases.

Figure 7:
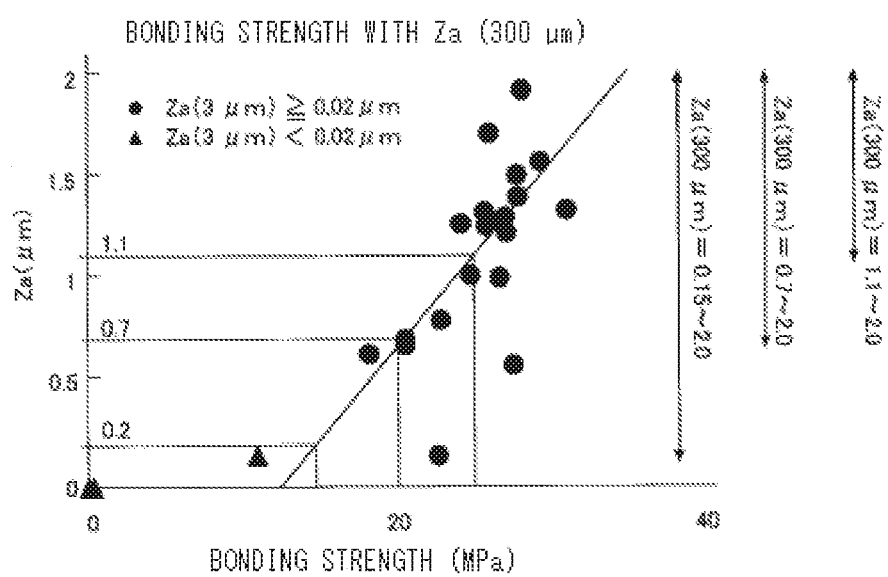
FIG. 7 is another graph showing the results of measuring the delamination strength between the insulated substrate and the sealing resin.

A body molded from the sealing resin 28 was formed on the surface of each of the resulting ceramic substrates, and the bonding strength was measured at room temperature in accordance with the method shown in FIG. 5. The results are shown in FIG. 7. In FIG. 7, black circles indicate substrates for which the average roughness derived in a 3-μm-wide range was 0.02 μm or greater, and black triangles indicate substrates for which the average roughness derived in a 3-μm-wide range was less than 0.02 μm. The vertical axis in FIG. 7 represents the value of the average roughness derived in a 300-μm-wide range, and the horizontal axis in FIG. 7 represents the value of the bonding strength (MPa).

As shown in FIG. 7, there was a tendency for the bonding strength to increase commensurately with an increase in the average roughness derived in a 300-μm-wide range. However, as the average roughness derived in a 300-μm-wide range approached 2 μm, the bonding strength tended not to improve any further.

Therefore, the average roughness derived in a 300-μm-wide range is preferably 0.15 to 2.0 μm, more preferably 0.7 to 2.0 μm, and most preferably 1.1 to 2.0 μm.

EXPLANATION OF REFERENCE NUMERALS

11 Insert case
12 External terminal
13 Case
14 Adhesive
21 Insulated circuit substrate
22 Metal sheet
23 Insulated substrate
24 Circuit pattern
25, 26 Semiconductor element
27 Bonding wire
28 Sealing resin
29 Solder
30 Surfaces of crystal grains
50, 50a Semiconductor module

The invention claimed is:
1. A semiconductor module comprising:
an insulated substrate;
a circuit pattern formed on the insulated substrate;
a semiconductor element joined on the circuit pattern; and
a sealing resin for sealing the insulated substrate, the circuit pattern, and the semiconductor element, wherein
a surface of the insulated substrate in a portion where the insulated substrate and the sealing resin are bonded has, in a cross-section of the insulated substrate, an average roughness derived in a 300-μm-wide range of 0.15 μm or greater and 2 μm or less, and an average roughness derived in a 3-μm-wide range of 0.02 μm or greater and 0.1 μm or less by that the surface of the insulated substrate in said portion is applied with a brazing material and then removed, the average roughness being measured and calculated in accordance with the following method, for measuring/calculating average roughness:

a cross-section of the insulated substrate is imaged using a scanning electron microscope to prepare an SEM image, the SEM image is binarized to prepare image data for a surface shape, the image data is converted to two-dimensional coordinate data using image quantification software, and the average roughness Za is derived by computation through the following formula, $$Za = \frac{1}{N} \sum_{n=1}^{N} |Zn| \quad \text{[Formula 1]}$$

in the formula, Za represents the average roughness, Zn represents the difference between the two-dimensional coordinate data and an average value for each n, N represents a value obtained by dividing a measured width by a measured pitch; in computation of the roughness for a width of 300 μm, the pitch is equal to 0.5 μm, that means N is equal to 600, and in computation of the roughness for a width of 3 μm, the pitch is equal to 0.005 μm, that means N is equal to 600.

2. The semiconductor module according to claim 1, wherein the portion where the insulated substrate and the sealing resin are bonded includes a peripheral edge part of the insulated substrate.

3. The semiconductor module according to claim 1, wherein the surface of the insulated substrate in the portion where the insulated substrate and the sealing resin are bonded is such that, in the cross-section of the insulated substrate, the average roughness derived in a 300-μm-wide range is 0.7 μm or greater.

4. The semiconductor module according to claim 1, wherein the insulated substrate is made of ceramic.

5. The semiconductor module according to claim 4, wherein the insulated substrate is composed of aluminum nitride.

6. The semiconductor module according to claim 2, wherein the surface of the insulated substrate in the portion where the insulated substrate and the sealing resin are bonded is such that, in the cross-section of the insulated substrate, the average roughness derived in a 300-μm-wide range is 0.7 μm or greater.

7. The semiconductor module according to claim 2, wherein the insulated substrate is made of ceramic.

8. The semiconductor module according to claim 3, wherein the insulated substrate is made of ceramic.

9. The semiconductor module according to claim 1, wherein the brazing material is applied on an entire surface of the insulated substrate where the sealing resin is applied, and is removed.

10. A method for manufacturing a semiconductor module, the method comprising:

a surface treatment step for adjusting surface roughness of a ceramic insulated substrate;

an oxidizing treatment step for heat-treating the insulated substrate to oxidize a surface of the insulated substrate;

a brazing material application step for applying a brazing material to the surface of the insulated substrate;

a metal foil joining step for joining a metal foil to the surface of the insulated substrate via the brazing material;

a circuit pattern formation step for etching the metal foil and the brazing material to form a circuit pattern;

a semiconductor element implementation step for joining a semiconductor element to the circuit pattern; and a sealing step for sealing the insulated substrate, the circuit pattern, and the semiconductor element using a sealing resin, wherein the surface treatment step includes a step for performing a wet blasting treatment on the surface of the insulated substrate to roughen the surface;

the brazing material application step includes a step for applying the brazing material not only to the surface of the insulated substrate where the metal foil is joined, but also to a surface of the insulated substrate where the metal foil is not joined, said surface being where the sealing resin is bonded; and in the circuit pattern formation step, a portion where the brazing material is applied is etched, whereby the surface of the insulated substrate where the sealing resin is bonded is configured to have a surface roughness such that, in a cross-section of the insulated substrate, the average roughness derived in a 300-μm-wide range is 0.15 μm or greater, and the average roughness derived in a 3-μm-wide range is 0.02 μm or greater, the average roughness being measured and calculated in accordance with the following method, method for measuring/calculating average roughness:

a cross-section of the insulated substrate is imaged using a scanning electron microscope to prepare an SEM image, the SEM image is binarized to prepare image data for a surface shape, the image data is converted to two-dimensional coordinate data using image quantification software, and the average roughness Za is derived by computation through the following formula, $$Za = \frac{1}{N} \sum_{n=1}^{N} |Zn| \quad \text{[Formula 2]}$$

in the formula, Za represents the average roughness, Zn represents the difference between the two-dimensional coordinate data and an average value for each n, N represents a value obtained by dividing a measured width by a measured pitch; in computation of the roughness for a width of 300 μm, the pitch is equal to 0.5 μm, that means N is equal to 600, and in computation of the roughness for a width of 3 μm, the pitch is equal to 0.005 μm, that means N is equal to 600.

11. The method for manufacturing a semiconductor module according to claim 10, wherein the insulated substrate is composed of aluminum nitride.

12. An insulated circuit substrate comprising:
an insulated substrate; and
a circuit pattern formed on the insulated substrate, wherein
a surface of the insulated substrate in a portion where the circuit pattern is not formed has, in a cross-section of the insulated substrate, an average roughness derived in a 300-μm-wide range of 0.15 μm or greater and 2 μm or less, and an average roughness derived in a 3-μm-wide range of 0.02 μm or greater and 0.1 μm or less by that the surface of the insulated substrate in said portion is applied with a brazing material and then removed, the average roughness being measured and calculated in accordance with the following method;
method for measuring/calculating average roughness:
a cross-section of the insulated substrate is imaged using a scanning electron microscope to prepare an SEM image, the SEM image is binarized to prepare image data for a surface shape, the image data is converted to two-dimensional coordinate data using image quantification software, and the average roughness Za is derived by computation through the following formula, $$Za = \frac{1}{N}\sum_{n=1}^{N} |Zn| \quad \text{[Formula 3]}$$

in the formula, Za represents the average roughness, Zn represents the difference between the two-dimensional coordinate data and an average value for each n, N represents a value obtained by dividing a measured width by a measured pitch; in computation of the roughness for a width of 300 μm, the pitch is equal to 0.5 that means N is equal to 600, and in computation of the roughness for a width of 3 μm, the pitch is equal to 0,005 μm, that means N is equal to 600.

13. The insulated circuit substrate according to claim 12, wherein the brazing material is applied on an entire surface of the insulated substrate where the sealing resin is applied, and is removed.

* * * * *